United States Patent [19]

Kawai et al.

[11] Patent Number: 5,001,084
[45] Date of Patent: Mar. 19, 1991

[54] METHOD FOR APPLYING A TREATMENT LIQUID ON A SEMICONDUCTOR WAFER

[75] Inventors: Akira Kawai; Shigeo Uoya, both of Itami, Japan

[73] Assignee: Mitsubishi Denki Kabushiki Kaisha, Japan

[21] Appl. No.: 357,286

[22] Filed: May 26, 1989

Related U.S. Application Data

[63] Continuation-in-part of Ser. No. 124,553, Nov. 24, 1987, abandoned.

[30] Foreign Application Priority Data

Nov. 27, 1986 [JP] Japan ................. 61-283402

[51] Int. Cl.$^5$ .................................... H01L 21/46
[52] U.S. Cl. .................... 437/231; 148/DIG. 17; 134/33
[58] Field of Search .............. 437/231; 148/DIG. 17; 134/33

[56] References Cited

U.S. PATENT DOCUMENTS 4,544,446 10/1985 Cady ............................... 134/33
4,871,417 10/1989 Nishizawa et al. ............. 134/33

FOREIGN PATENT DOCUMENTS 56-87471  7/1981 Japan .
58-168238 10/1983 Japan ..................... 134/33
60-085524  5/1985 Japan ..................... 437/231
61-150332  7/1986 Japan ..................... 437/231
61-184824  8/1986 Japan ..................... 437/231

Primary Examiner—Brian E. Hearn
Assistant Examiner—Laura M. Holtzman
Attorney, Agent, or Firm—Leydig, Voit & Mayer

[57] ABSTRACT

A method of applying a treatment liquid to a semiconductor wafer to form a coating include rotating a semiconductor wafer in its own plane within a hermetically-sealed container, discharging a cleaning fluid through a cleaning fluid nozzle onto the top surface of the wafer as it rotates, and then discharging a treatment liquid through a treatment liquid nozzle onto the center of the top surface of the wafer as it rotates. An apparatus for coating a treatment liquid on a semiconductor wafer comprises a hermetically-sealed container, a wafer chuck which rotates a semiconductor wafer in its own plane, a treatment liquid nozzle for connection to a supply of treatment liquid and discharging the treatment liquid onto the center of the top surface of the wafer as it rotates, and a cleaning fluid nozzle which is disposed to discharge a pressurized cleaning fluid onto the top surface of the wafer as it rotates.

4 Claims, 2 Drawing Sheets

METHOD FOR APPLYING A TREATMENT LIQUID ON A SEMICONDUCTOR WAFER

This disclosure is a continuation-in-part of U.S. patent application Ser. No. 07/124,553, filed Nov. 24, 1987, now abandoned.

BACKGROUND OF THE INVENTION

This invention relates to a method of applying a treatment liquid to a semiconductor wafer to form a coating and to an apparatus for carrying out the method.

In the manufacture of semiconductor devices, various liquid chemicals, which will hereinunder be collectively referred to as treatment liquids, must be applied to the surface of a semiconductor wafer to form coating. One commonly-used method of applying these treatment liquids is referred to as spin coating. In this method, a semiconductor wafer is supported atop a chuck which is rotated at a high speed. A treatment liquid is dripped or sprayed onto the center of the top surface of the wafer, and the centrifugal force which acts on the treatment liquid causes it to spread outwards over the surface of the wafer and form a uniform coating.

FIG. 1 schematically illustrates a conventional spin coating apparatus. A wafer chuck 1 which rotates at a high speed is disposed inside a hermetically-sealed container 2. A semiconductor wafer 3 is held to the top surface of the chuck 1 by suction. As the wafer 3 is rotated by the chuck 1, a treatment liquid 5 is sprayed onto the top surface of the wafer 3 through a nozzle 4. A portion of the treatment liquid 5 is scattered by centrifugal force beyond the wafer 3. Upon striking the inner surface 2a of the sealed container 2, the treatment liquid 5 flows downwards and is removed from the sealed container 2 via exhaust pipes 6.

When a large number of wafers 3 are coated with a treatment liquid using an apparatus of this type, the inner surface 2a of the sealed container 2 becomes covered with drops of the treatment liquid 5, and a substantial amount of mist of the treatment liquid 5 is formed. A portion of the mist adheres to the top surface 3a of the wafer 3, producing defects in the pattern on the wafer 3 and decreasing the yield of wafers 3.

SUMMARY OF THE INVENTION

Accordingly, it is an object of this invention to provide a method for applying a treatment liquid to the surface of a semiconductor wafer by spin coating which can prevent the formation of pattern defects due to a mist of treatment liquid.

It is another object of this invention to provide an apparatus for carrying out this method.

In a coating method in accordance with the present invention, a cleaning fluid is discharged onto one surface of a semiconductor wafer while it is being rotated at a high speed within a sealed container. The cleaning fluid is thrown outwards from the surface of the wafer by centrifugal force and strikes the inner surface of the sealed container. The cleaning fluid then flows downwards along the inner surface of the container and, in doing so, removes any treatment liquid which is adhering to the inner surface of the container. Thereafter, a treatment liquid is discharged onto the surface of the wafer to form a coating. As a result, the inner surface of the container is kept clean of treatment liquid, a mist of treatment liquid is not formed, and pattern defects due to such a mist are prevented.

A coating apparatus for carrying out the above-described method comprises a sealed container, a rotating chuck for rotating a semiconductor wafer at a high speed within the sealed container, a cleaning fluid nozzle for discharging a cleaning fluid onto the top surface of the semiconductor wafer, a treatment liquid nozzle for discharging a treatment liquid onto the top surface of the semiconductor wafer, and means for supplying a cleaning fluid under pressure to the cleaning fluid nozzle.

There is no restriction on the number of cleaning fluid nozzles, but a preferred embodiment employs a single treatment liquid nozzle and a single cleaning fluid nozzle. In a preferred embodiment, the cleaning fluid nozzle is a tubular nozzle which produces a jet of cleaning fluid. However, a spray nozzle or other type of nozzle may also be employed.

A coating apparatus of the present invention can be employed for the application of various types of treatment liquids, including photosensitive liquid resins and silica coating fluids.

BRIEF DESCRIPTION OF THE DRAWINGS

In the drawings, the same reference numerals indicate the same or corresponding parts.

DESCRIPTION OF THE PREFERRED EMBODIMENTS

Figure 1:
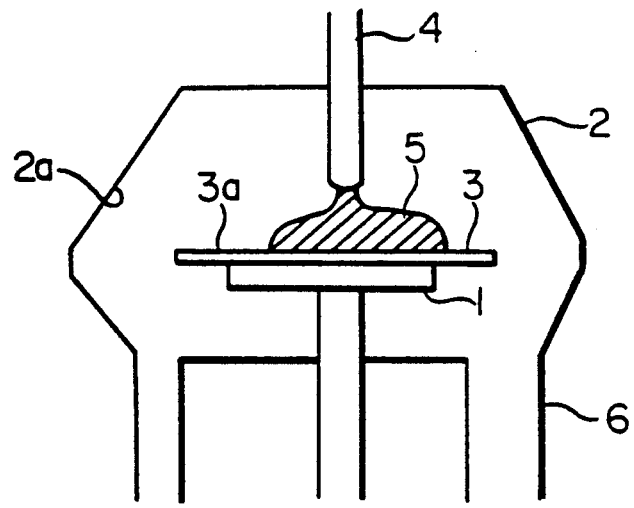
FIG. 1 is a schematic illustration of a conventional spin coating apparatus.
Figure 2:
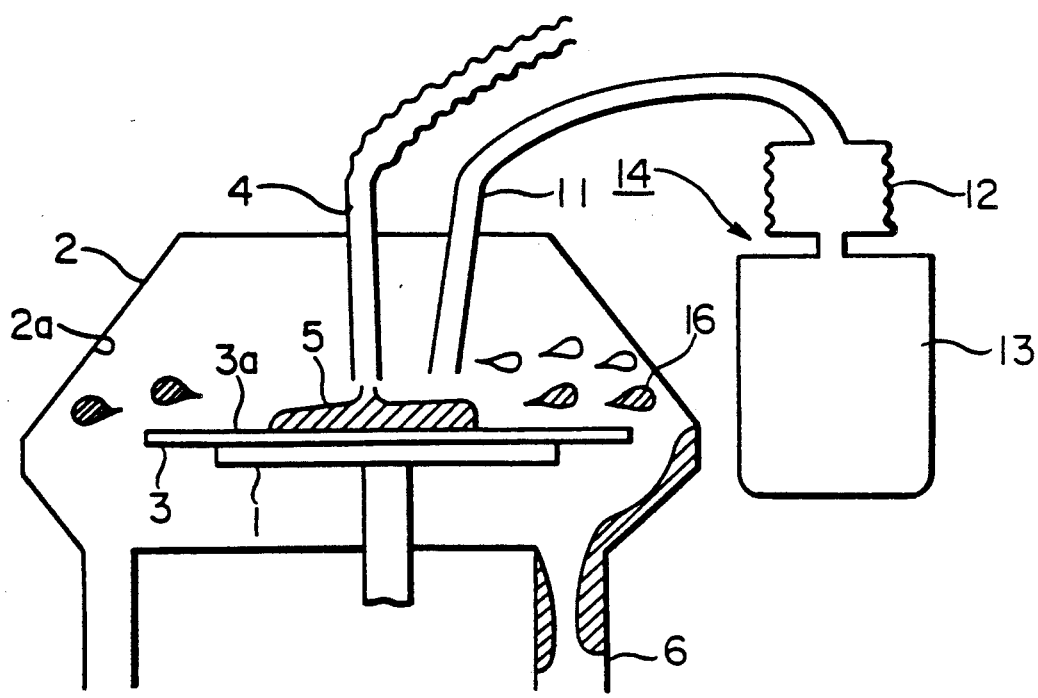
FIGS. 2 and 3 are schematic illustrations of an embodiment of a coating apparatus in accordance with the present invention but showing different operating conditions.

A preferred embodiment of an apparatus for coating a treatment liquid on a semiconductor wafer in accordance with the present invention will now be described while referring to FIGS. 2 and 3 which schematically illustrate this embodiment. As is the case for the conventional apparatus of FIG. 1, a hermetically-sealed container 2 houses a rotating wafer chuck 1, on the top surface of which a semiconductor wafer 3 is held by suction. A number of exhaust pipes 6 are connected to the bottom of the sealed container 2. A treatment liquid nozzle 4 extends through the top of the sealed container 2. Its lower end confronts the center of the top surface of the semiconductor wafer 3, and its upper end is connected to an unillustrated source of treatment liquid. A cleaning fluid nozzle 11 also extends through the top of the sealed container 2. The cleaning fluid nozzle 11 is a tubular nozzle whose lower end is disposed at a location offset from the center of the wafer chuck 1, i.e., to one side of the treatment liquid nozzle 4 to discharge cleaning fluid under pressure against the top surface of the wafer 3. Its upper end is connected to a supply mechanism 14 for supplying pressurized cleaning fluid comprising a fluid pressurizing device 12 and a bottle 13 of cleaning fluid 16.

The operation of this embodiment is as follows. As the wafer 3 is being rotated at a high speed by the chuck 1, a cleaning fluid 16 is discharged from the cleaning fluid nozzle 11 onto the top surface 3a of the rotating semiconductor wafer 3, as shown in FIG. 2. The cleaning fluid 16 is scattered by centrifugal force to the outer periphery of the wafer 3. Some of the cleaning fluid 16 strikes the inner surface 2a of the sealed container 2 and flows down the inner surface 2a into the exhaust pipes 6. Any treatment liquid adhering to the inner surface 2a of the sealed container 2 is rinsed off by the cleaning fluid 16 and flows downwards into the exhaust pipes 6 together with the cleaning fluid 16. For example, in the case of a treatment liquid in the form of SOG, which vaporizes as a gel and cannot be easily removed by an SOG solvent, an acidic cleaning fluid such as HF is required for removal. Also, in the case of a treatment liquid, such as a resist, much of the photosensitive material contained in the resist adhere to the inner surface 2a of the container 2, and it is difficult to remove the photosensitive material by means of a resist solvent. Therefore, in this case, it is necessary to use a strong solvent, such as acetone.

Figure 3:
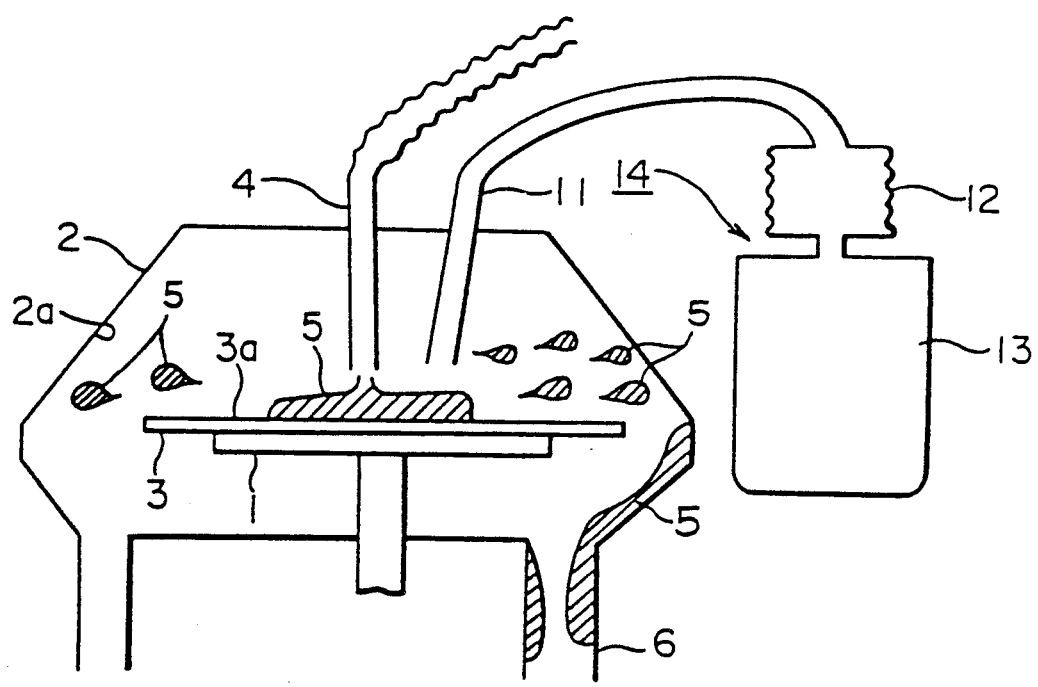

Thereafter, a treatment liquid 5 is discharged onto the surface 3a of the wafer 3 through the treatment liquid nozzle 4, as shown in FIG. 3. The centrifugal force produced by the rotation of the wafer 3 causes the treatment liquid 5 to spread outwards over the top surface 3a and, at the same time, causes a portion of the treatment liquid 5 to be scattered outwards against the inner surface 2a of the sealed container 2.

Therefore, since any treatment liquid adhering to the inner surface 2a of the sealed container 2 is removed by the cleaning fluid 16, even if a large number of wafers 3 are coated, the treatment liquid does not accumulate on the inner surface 2a of the sealed container 2 and a mist of the treatment liquid is not formed. Accordingly, pattern defects due to a mist of different treatment liquids are prevented and the yield of wafers 3 is greatly increased. Futhermore, the automatic cleaning of the inside of the sealed container 2 increases working efficiency.

What is claimed is:

1. A method of applying a treatment liquid to semiconductor wafers sequentially to form a coating of the treatment liquid on each of the semiconductor wafers comprising:

mounting one of the semiconductor wafers on a wafer chuck in a hermetically sealable container, said container having an inner surface to which a treatment liquid adhered during coating of another semiconductor wafer with the treatment liquid;

after mounting said semiconductor wafer, rotating said semiconductor wafer in its plane by rotating said wafer chuck;

while rotating said semiconductor wafer, discharging a cleaning fluid onto a surface of said rotating semiconductor wafer to scatter said cleaning fluid from said wafer surface onto the inner surface of said container to remove the treatment liquid adhering to said container inner surface and, while rotating said semiconductor wafer, after discharging the cleaning fluid, discharging a treatment liquid onto the surface of said semiconductor wafer to coat the surface with the treatment liquid; and stopping said rotation of said wafer chuck and said semiconductor wafer and removing the semiconductor wafer from said container in preparation for coating another semiconductor wafer with the treatment liquid in said container.

2. A method of coating a surface of a semiconductor wafer as claimed in claim 1, including discharging said treatment liquid through a first nozzle onto the center of said semiconductor wafer.

3. A method of coating a surface of a semiconductor wafer as claimed in claim 2, including discharging said cleaning fluid through a second nozzle onto said semiconductor wafer at a location offset from the center of said wafer.

4. A method of coating a surface of a semiconductor wafer as claimed in claim 1, wherein said semiconductor wafer has a diameter greater than that of said wafer chuck.

* * * * *